United States Patent
Stamenovic et al.

(10) Patent No.: US 10,369,777 B2
(45) Date of Patent: Aug. 6, 2019

(54) SYSTEM FOR REDUCING ABLATION DEBRIS

(71) Applicant: AGFA NV, Mortsel (BE)

(72) Inventors: Milan Stamenovic, Mortsel (BE); Jan Dierckx, Mortsel (BE); Peter Hendrikx, Mortsel (BE)

(73) Assignee: AGFA NV, Mortsel (BE)

( * ) Notice: Subject to any disclaimer, the term of this patent is extended or adjusted under 35 U.S.C. 154(b) by 224 days.

(21) Appl. No.: 15/533,106

(22) PCT Filed: Nov. 25, 2015

(86) PCT No.: PCT/EP2015/077647
§ 371 (c)(1),
(2) Date: Jun. 5, 2017

(87) PCT Pub. No.: WO2016/091589
PCT Pub. Date: Jun. 16, 2016

(65) Prior Publication Data
US 2017/0326869 A1    Nov. 16, 2017

(30) Foreign Application Priority Data
Dec. 8, 2014 (EP) .................................. 14196734

(51) Int. Cl.
| B41C 1/10 | (2006.01) |
| G03F 7/20 | (2006.01) |
| G03F 7/30 | (2006.01) |

(52) U.S. Cl.
CPC .......... *B41C 1/1016* (2013.01); *B41C 1/1008* (2013.01); *G03F 7/202* (2013.01); *G03F 7/3007* (2013.01); *B41C 2210/02* (2013.01); *B41C 2210/04* (2013.01); *B41C 2210/06* (2013.01); *B41C 2210/24* (2013.01)

(58) Field of Classification Search
None
See application file for complete search history.

(56) References Cited

U.S. PATENT DOCUMENTS

| 5,574,493 A | 11/1996 | Sanger et al. |
| 2003/0108817 A1 | 6/2003 | Patel et al. |
| 2006/0029881 A1 | 2/2006 | Tao et al. |
| 2013/0029268 A1 | 1/2013 | Koyama et al. |

FOREIGN PATENT DOCUMENTS

| EP | 0 580 393 A2 | 1/1994 |
| EP | 0 999 042 A1 | 5/2000 |
| EP | 1 110 628 A1 | 6/2001 |
| JP | 2003-156850 A | 5/2003 |
| JP | 2005-099631 A | 4/2005 |
| JP | 2008-509245 A | 3/2008 |
| JP | 2008-197566 A | 8/2008 |
| WO | 2011/110467 A2 | 9/2011 |

OTHER PUBLICATIONS

Official Communication issued in International Patent Application No. PCT/EP2015/077647, dated Feb. 19, 2016.

*Primary Examiner* — Joshua D Zimmerman
(74) *Attorney, Agent, or Firm* — Keating and Bennett, LLP (57) ABSTRACT

A system for exposing a heat and/or light sensitive printing plate precursor including a coating on a support includes a platesetter including a laser head for generating a laser beam to create an image, and the platesetter further includes an electrostatic generator capable of electrostatically charging the surface of the coating.

15 Claims, 2 Drawing Sheets

SYSTEM FOR REDUCING ABLATION DEBRIS

CROSS REFERENCE TO RELATED APPLICATIONS

This application is a 371 National Stage Application of PCT/EP2015/077647, filed Nov. 25, 2015. This application claims priority to European Application No. 14196734.9, filed Dec. 8, 2014, which is incorporated by reference herein in its entirety.

BACKRGOUND OF THE INVENTION

1. Field of the Invention

The present invention relates to a novel system for reducing ablation debris by means of applying electrostatic charges before and/or during laser exposure of a lithographic printing plate.

2. Description of the Related Art

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive areas and during driographic printing, only ink is supplied to the master.

Lithographic printing masters are generally obtained by the image-wise exposure and processing of an imaging material called plate precursor. The coating of the precursor is exposed image-wise to heat or light, typically by means of a digitally modulated exposure device such as a laser, which triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer.

Some plate precursors are capable of producing a lithographic image immediately after exposure without wet processing and are for example based on ablation of one or more layers of the coating. At the exposed areas the surface of an underlying layer is revealed which has a different affinity towards ink or fountain than the surface of the unexposed coating. Other thermal processes which enable plate making without wet processing are for example processes based on a heat-induced hydrophilic/oleophilic conversion of one or more layers of the coating so that at exposed areas a different affinity towards ink or fountain is created than at the surface of the unexposed coating.

The most popular plate precursors require wet processing since the exposure produces a difference of solubility or of rate of dissolution in a developer between the exposed and the non-exposed areas of the coating. In positive working plates, the exposed areas of the coating dissolve in the developer while the non-exposed areas remain resistant to the developer. In negative working plates, the non-exposed areas of the coating dissolve in the developer while the exposed areas remain resistant to the developer. Most plates contain a hydrophobic coating on a hydrophilic support, so that the areas which remain resistant to the developer define the ink-accepting, printing areas of the plate while the hydrophilic support is revealed by the dissolution of the coating in the developer at the non-printing areas.

Thermal plates are generally exposed to infrared light in a platesetter, which can be of the internal drum (ITD), external drum (XTD) or flatbed type. The availability of low-cost, high-power infrared laser diodes enables to manufacture platesetters wherein thermal plate materials can be exposed at a higher drum rotation speed, resulting in a shorter total exposure time and a higher plate throughput. The high power infrared laser diodes are able to provide a high power density at the plate surface resulting in the necessary amount of energy in a shorter pixel dwell time. It is observed that such a high power exposure of so-called non-ablative thermal plates, i.e. plates which are not designed to form an image by ablation, nevertheless produces partial ablation of the coating. This phenomenon is to be avoided in view of the problems associated with the generation of ablation debris such as for example contamination of the electronics and optics of the exposure device.

Solutions to solve this ablation problem are provided in the art by optimizing the coating composition so that a minimum of ablation during exposure to high power infrared laser light occurs.

The Japanese Patent Applications JP-A 2008-197566 and JP 2008-509245 disclose for the purpose of inhibiting ablation an image recording layer including a binder having a specific structure. JP-A 2003-156850 discloses a barrier layer on the image recording layer to prevent ablation, however, a barrier layer provided on the image recording layer delays penetration of the developer into the image recording layer and so reduces the developability of the coating.

JP 2005-99631 discloses that a binder capable of improving film properties, inhibits ablation of the image recording layer wherein it is used. However, due to the improved film properties, the permeability of a developer in the non-image portion is suppressed and therefore, also here the developability of the coating is deteriorated.

U.S. 2013/0029268 discloses an image recording layer capable of inhibiting ablation combined with an excellent printing durability and developability, containing an infrared absorber and a copolymer containing a repeating unit having a zwitterionic structure in a side chain and a repeating unit having a hetero alicyclic structure in the main chain.

U.S. Pat. No. 5,574,493 provides a solution to the problem of ablative debris by means of an apparatus including a vacuum source and a vacuum chamber which removes the airborne ablation debris after exposure. However, the use of such an apparatus requires a lot of space nearby the platesetter, creates a lot of noise and demands regular maintenance.

Although many attempts have been made in the prior art to provide printing plates in which ablation is reduced and/or inhibited, the formation of ablation debris during laser exposure is still a major concern in the art.

SUMMARY OF THE INVENTION

It is an object of the present invention to provide a system for exposing a heat and/or light sensitive printing plate precursor including a coating on a support, characterized in that airborne ablation debris which may be formed during the exposure step of the lithographic printing plate precursor is effectively reduced and/or even prevented. By reducing airborne ablation debris which may be formed during the exposure step, contamination of the environment, e.g. the optics and electronics of the laser-exposure apparatus, is avoided. This object is realized by the system defined below. The system defined below essentially includes a laser-exposure apparatus and a device capable of electrostatically charging the surface of the coating of the printing plate precursor.

By creating electrostatic charges during offset plate imaging, it was surprisingly found that the presence of airborne ablation debris which may be formed during the laser exposure step, is highly reduced and/or even completely eliminated. As a purely physical phenomenon, electrostatic charging reduces and/or eliminates airborne ablation debris without compromising the chemical coating composition and/or the properties of the printing plate.

It is a further object of the present invention to provide a method for making a printing plate comprising the steps of applying a heat and/or light sensitive coating on a support thereby obtaining a printing plate precursor, image-wise exposing said precursor by means of the system according to the present invention and optionally developing the precursor.

Specific features for preferred embodiments of the invention are set out below. Further advantages and embodiments of the present invention will become apparent from the following description and drawings.

DETAILED DESCRIPTION OF THE PREFERRED EMBODIMENTS

The system of the present invention comprises a laser-exposure apparatus and a device capable of electrostatically charging the surface of the coating of the printing plate precursor. This device is further also referred to as "the electrostatic generator". The electrostatic generator is generally a small and convenient device which can easily be integrated in a laser-exposure apparatus, also referred to herein as platesetter, as known in the art. The electrostatic generator is preferably mounted in such a way that the imaging areas are charged before and/or at the same time the laser is imaging the plate. In other words, the coating of the precursor is preferably first electrostatically charged and then exposed, or simultaneously charged and exposed. Alternatively, the coating of the printing plate precursor may be electrostatically charged before the precursor is mounted on the platesetter.

The platesetter preferably includes a flat-bed, an internal (ITD) or external drum (XTD) support on which the printing plate precursor is mounted and a laser head for laser imaging the plate. A laser-exposure apparatus including an internal drum ITD is typically characterized by a very high scan speed up to 500 m/sec and may require a laser power of several Watts. A laser-exposure apparatus including an external drum typically operates with multibeams each with a laser power from about 20 mW to about 1 W and at a lower scan speed, e.g. from 0.1 to 10 m/sec. A laser-exposure apparatus including an XTD equipped with one or preferably more laserdiodes emitting in the wavelength range between 750 and 850 nm is an especially preferred embodiment of the present invention.

The system of the present invention can be used as an off-press exposure apparatus, which offers the benefit of reduced press down-time. The system of the present invention including an XTD laser-exposure apparatus can also be used for on-press exposure, offering the benefit of immediate registration in a multi-color press. More technical details of on-press exposure apparatuses are described in e.g. U.S. Pat. Nos. 5,174,205 and 5,163,368.

The electrostatic generator electrostatically charges the surface of the coating of the printing plate precursor and/or, if present, dust particles ejected from that surface during the laser exposure step. Without being bound to any theoretical explanation, a possible working mechanism is the following. Upon charge stimulation, the surface of the coating of the printing plate precursor becomes electrostatically charged by a direct current or DC current generated by the electrostatic generator. Due to the resistivity of the coating, this surface charge induces a counter-charge (opposite sign) in the support and/or the drum or flatbed upon which the precursor is mounted, and a strong electric field is formed. As a result, the formation of ablation debris during laser exposure is highly reduced and/or even prevented. In addition, it is believed that airborne ablation debris located in the airspace between the printing plate precursor and the electrostatic generator, if present, will become attracted to the counter-charged support. The applied electrostatic charges to the surface of the coating and/or to the airborne dust particles, may be either positive whereby a negative counter-charge is formed in the support and/or drum or flatbed upon which the precursor is mounted, or negative whereby a positive counter-charge is formed in the support and/or drum or flatbed upon which the precursor is mounted. The drum or flatbed upon which the precursor is mounted is preferably grounded.

The electrostatic generator preferably includes at least one charging bar which is connected to a DC high voltage generator used in either a constant current source mode, or in a constant voltage mode which generates a current. Preferably, a constant current of 0.5 µA or more is generated by the high voltage generator, more preferably a current ranging between 5 and 100 µA, and most preferably a current ranging between 10 and 40 µA. By generating a current, an electrical field is formed and the surface of the support becomes electrostatically charged. Depending on the type of laser-exposure apparatus i.e. external, internal or flatbed platesetter, the drum/scan speed and/or the laser power on the one hand, and/or the type, dimensions, settings and/or position in the laser-exposure apparatus of the electrostatic generator on the other hand, a specific current density ($\mu C/m^2$) is created at the surface of the support. The current density ($\mu C/m^2$) preferably ranges between 2 and 500 $\mu C/m^2$, more preferably between 25 and 400 $\mu C/m^2$ and most preferably between 40 and 350 $\mu C/m^2$. In order to create a sufficient electrostatically charged surface, it is up to the person skilled in the art to adapt the above described variables.

The system according to the present invention preferably includes at least one electrostatic generator but may include two or more electrostatic generators. Charge can be applied by one or more charging bars including specific arrangements of electrodes. The electrodes may for example be needle or pin shaped (e.g. pinner electrodes) or be in the form of one or more wires. Suitable examples of charging bars including pinner electrodes may contain at least one electrode, preferably including 2 to 20 electrodes, more preferably 3 to 10 electrodes and most preferably 4 to 6 electrodes. Charging bars in the form of a wire may include 1 to 1000 electrodes, preferably 5 to 500 and most preferably 10 to 100 electrodes. For example, depending on system geometry and timing, a charging bar including a single point source (e.g. 1-needle electrode) can be sufficient to apply the minimum required charge density, for example for an external drum platesetter. For flat bed or internal drum platesetters where a fixed laser is used, the full scan or laser line write length has to be charged at the same moment and therefore a charging bar in the form of a wire including multiple electrodes is preferred.

Figure 1:
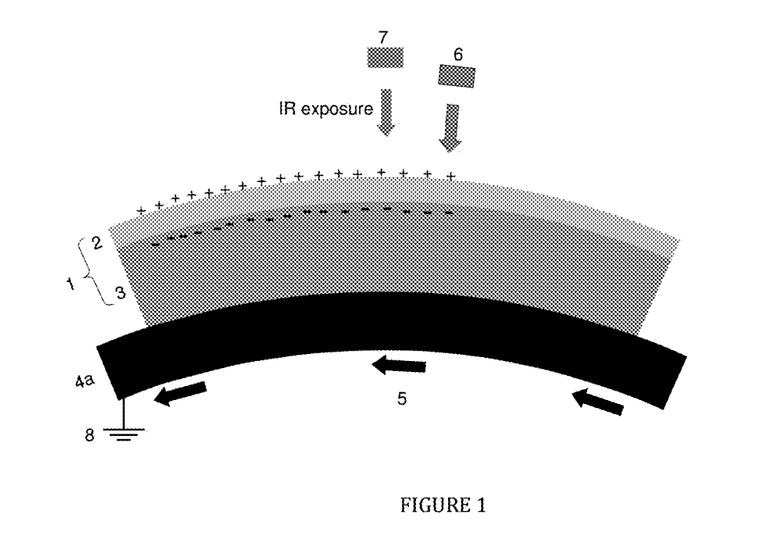
FIG. 1 shows a preferred embodiment of the system for exposing a printing plate precursor including an external drum.
Figure 2:
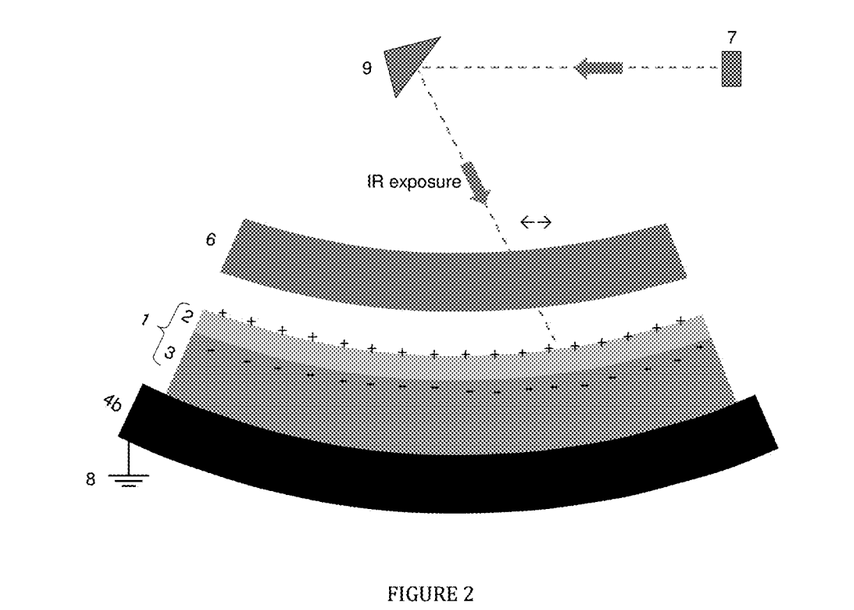
FIG. 2 shows a preferred embodiment of the system for exposing a printing plate precursor including an internal drum.

Preferred embodiments of the present invention are shown in FIGS. 1 and 2. In FIG. 1, a laser-exposure apparatus including an external drum (4a) is shown wherein a printing plate precursor (1) including a coating (2) and a support (3) is mounted on the external drum (4a) with drum rotation (5). The electrostatic generator (6) is positioned in the laser-exposure apparatus so that it can first electrostatically charge the surface of the coating (2) before the coating is exposed with the laser head (7). In FIG. 2 an embodiment including an internal drum (4b) is presented. The same configuration as given in FIG. 2 is suitable for a flatbed platesetter. The main difference with FIG. 1 is that the laser-exposure apparatus includes an internal drum or flatbed which does not rotate but wherein a laser beam images the plate by means of a rotating mirror (9) which directs the laser beam on the coating. The electrostatic generator (6) is positioned in the laser-exposure apparatus so that the full scan or laser write width can be charged before or at the same time the coating is being imaged. The drums (4a) and (4b) are grounded (8).

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer such as polyester film including polyethylene terephthalate film and polyethylene naphthalate film, cellulose acetate film, polystyrene film, polycarbonate film, etc. The plastic film support may be opaque or transparent.

A particularly preferred lithographic support is a grained and anodized aluminum support. The aluminum support has usually a thickness of about 0.1-0.6 mm. However, this thickness can be changed appropriately depending on the size of the printing plate used and/or the size of the platesetters on which the printing plate precursors are exposed. The aluminum is preferably grained by electrochemical graining, and anodized by means of anodizing techniques employing phosphoric acid or a sulphuric acid/phosphoric acid mixture. Methods of both graining and anodization of aluminum are well known in the art. The anodic layer may, in combination with the coating layer, act as a non conductive or insulating layer whereby the aluminum underneath becomes respectively negatively or positively counter-charged upon respectively positively or negatively electrostatically charging the surface of the coating with the electrostatic generator.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 µm. The aluminum substrate of the current invention has preferably an Ra value between 0.30 µm and 0.60 µm, more preferably between 0.35 µm and 0.55 µm and most preferably between 0.40 µm and 0.50 µm. The lower limit of the Ra value is preferably about 0.1 µm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight ($g/m^2$ $Al_2O_3$ formed on the aluminium surface) varies between 1 and 8 $g/m^2$. The anodic weight is preferably between 1.5 $g/m^2$ and 5.0 $g/m^2$, more preferably 2.5 $g/m^2$ and 4.0 $g/m^2$ and most preferably 2.5 $g/m^2$ and 3.5 $g/m^2$.

The grained and anodized aluminum support may be subject to a so-called post-anodic treatment to improve the hydrophilic character of its surface. For example, the aluminum support may be silicated by treating its surface with a solution including one or more alkali metal silicate compound(s)—such as for example a solution including an alkali metal phosphosilicate, orthosilicate, metasilicate, hydrosilicate, polysilicate or pyrosilicate—at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution, gluconic acid, or tartaric acid. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, acetals of polyvinyl alcohols formed by reaction with a sulphonated aliphatic aldehyde, polyacrylic acid or derivates such as GLASCOL E15™ commercially available from Ciba Speciality Chemicals. One or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

In a preferred embodiment, the support is first treated with an aqueous solution including one or more silicate compound(s) as descibed above followed by the treatment of the support with an aqueous solution including a compound having a carboxylic acid group and/or a phosphonic acid group, or their salts. Particularly preferred silicate compounds are sodium or potassium orthosilicate and sodium or potassium metasilicate. Suitable examples of a compound with a carboxylic acid group and/or a phosphonic acid group and/or an ester or a salt thereof are polymers such as polyvinylphosphonic acid, polyvinylmethylphosphonic acid, phosphoric acid esters of polyvinyl alcohol, polyacrylic acid, polymethacrylic acid and a copolymer of acrylic acid and vinylphosphonic acid. A solution comprising polyvinylphosphonic acid or poly(meth)acrylic acid is highly preferred.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

The flexible support which may be provided with a hydrophilic layer may, in combination with the coating layer, act as a non conductive or insulating layer whereby the drum or flatbed upon which the precursor is mounted in the laser exposure apparatus may become respectively negatively or positively counter-charged upon respectively positively or negatively electrostatically charging the surface of the coating with the electrostatic generator.

According to the present invention, there is also provided a method for making a lithographic printing plate including the steps of (i) exposing—by means of the exposure system according to the present invention as described above—a printing plate precursor including a heat and/or light-sensitive coating on a hydrophilic support and (ii) optionally developing. The lithographic printing plate precursor used in the present invention can be based on a switchable or ablative mechanism where a hydrophylic/oleophilic differentiation is obtained by respectively a switching reaction or a removal of a hydrophilic or oleophilic topcoat whereby an underlying oleophilic respectively hydrophilic surface is obtained. The precursor can also be negative or positive working, i.e. can form ink-accepting areas at exposed or at non-exposed areas respectively. Below, suitable examples of heat- and light-sensitive coatings and coatings based on a switchable or ablative mechanism are discussed in detail.

Heat-sensitive printing plate precursors.

The imaging mechanism of the heat-sensitive printing plate precursors can be triggered by direct exposure to heat, e.g. by means of a thermal head, or by the light absorption of one or more compounds in the coating that are capable of converting light, more preferably infrared light, into heat. These heat-sensitive lithographic printing plate precursors are preferably not sensitive to visible light, i.e. no substantial effect on the dissolution rate of the coating in the developer is induced by exposure to visible light. Most preferably, the coating is not sensitive to ambient daylight.

A first suitable example of a thermal printing plate precursor is a precursor based on heat-induced coalescence of hydrophobic thermoplastic polymer particles which are preferably dispersed in a hydrophilic binder, as described in e.g. EP 770 494, EP 770 495, EP 770 497, EP 773 112, EP 774 364, EP 849 090, EP 1 614 538, EP 1 614 539, EP 1 614 540, EP 1 777 067, EP 1 767 349, WO 2006/037716, WO 2006/133741 and WO 2007/045515. According to a preferred embodiment, the thermoplastic polymer particles include styrene and acrylonitrile units in a weight ratio between 1:1 and 5:1 (styrene:acrylonitrile), e.g. in a 2:1 ratio. Examples of suitable hydrophilic binders are homopolymers and copolymers of vinyl alcohol, acrylamide, methylol acrylamide, methylol methacrylamide, acrylic acid, methacrylic acid, hydroxyethyl acrylate, hydroxyethyl methacrylate and maleic anhydride/vinylmethylether copolymers.

Preferably such an image-recording layer comprises an organic compound including at least one phosphonic acid group or at least one phosphoric acid group or a salt thereof, as described in WO 2007/04551.

In a second suitable embodiment, the thermal printing plate precursor comprises a coating comprising an aryldiazosulfonate homo- or copolymer which is hydrophilic and soluble in the processing liquid before exposure to heat or UV light and rendered hydrophobic and less soluble after such exposure.

Preferred examples of such aryldiazosulfonate polymers are the compounds which can be prepared by homo- or copolymerization of aryldiazosulfonate monomers with other aryldiazosulfonate monomers and/or with vinyl monomers such as (meth)acrylic acid or esters thereof, (meth)acrylamide, acrylonitrile, vinylacetate, vinylchloride, vinylidene chloride, styrene, α-methyl styrene etc. Suitable aryldiazosulfonate monomers are disclosed in EP-A 339393, EP-A 507008 and EP-A 771645 and suitable aryldiazosulfonate polymers are disclosed in EP 507,008, EP 960,729, EP 960,730 and EP1,267,211.

A further suitable thermal printing plate precursor is positive working and relies on heat-induced solubilization of an oleophilic resin. The oleophilic resin is preferably a polymer that is soluble in an aqueous developer, more preferably an aqueous alkaline developing solution with a pH between 7.5 and 14. Preferred polymers are phenolic resins e.g. novolac, resoles, polyvinyl phenols and carboxy substituted polymers. Typical examples of these polymers are described in DE-A-4007428, DE-A-4027301 and DE-A-4445820. The amount of phenolic resin present in the imaging layer is preferably at least 50% by weight, preferably at least 80% by weight relative to the total weight of all the components present in the imaging layer.

In a preferred embodiment, the oleophilic resin is preferably a phenolic resin wherein the phenyl group or the hydroxy group is chemically modified with an organic substituent. The phenolic resins which are chemically modified with an organic substituent may exhibit an increased chemical resistance against printing chemicals such as fountain solutions or plate treating liquids such as plate cleaners. Examples of such chemically modified phenolic resins are described in EP-A 0 934 822, EP-A 1 072 432, U.S. Pat. No. 5 641 608, EP-A 0 982 123, WO 99/01795, EP-A 02 102 446, EP-A 02 102 444, EP-A 02 102 445, EP-A 02 102 443, EP-A 03 102 522. The modified resins described in EP-A 02 102 446, are preferred, especially those resins wherein the phenyl-group of said phenolic resin is substituted with a group having the structure —N=N—Q, wherein the —N=N— group is covalently bound to a carbon atom of the phenyl group and wherein Q is an aromatic group.

In the latter embodiment the coating may comprise a second layer that comprises one or more other binder(s) which is insoluble in water and soluble in an alkaline solution such as an organic polymer which has acidic groups with a pKa of less than 13 to ensure that the layer is soluble or at least swellable in aqueous alkaline developers. This layer is located between the layer described above comprising the oleophilic resin and the hydrophilic support. The binder may be selected from a polyester resin, a polyamide resin, an epoxy resin, an acrylic resin, a methacrylic resin, a styrene based resin, a polyurethane resin or a polyurea resin. The binder may have one or more functional groups. The functional group(s) can be selected from the list of (i) a sulfonamide group such as —NR—SO$_2$—, —SO$_2$—NR— or —SO$_2$—NR'R" wherein R and R' independently represent hydrogen or an optionally substituted hydrocarbon group such as an optionally substituted alkyl, aryl or heteroaryl group; more details concerning these polymers can be found in EP 2 159 049;

(ii) a sulfonamide group including an acid hydrogen atom such as —SO$_2$—NH—CO— or —SO$_2$—NH—SO$_2$— as for example disclosed in U.S. Pat. No. 6,573,022; suitable examples of these compounds include for example N-(p-toluenesulfonyl) methacrylamide and N-(p-toluenesulfonyl) acrylamide;

(iii) an urea group such as —NH—CO—NH—, more details concerning these polymers can be found in WO 01/96119;

(iv) a star polymer in which at least three polymer chains are bonded to a core as described in EP 2 497 639;

(v) a carboxylic acid group;

(vi) a nitrile group;

(vii) a sulfonic acid group; and/or (viii) a phosphoric acid group.

(Co)polymers including a sulfonamide group are preferred. Sulfonamide (co)polymers are preferably high molecular weight compounds prepared by homopolymerization of monomers containing at least one sulfonamide group or by copolymerization of such monomers and other polymerizable monomers. Preferably, in the embodiment where the poly(vinyl acetale) binder of the present invention is present in the second layer, the copolymer comprising at least one sulfonamide group is present in the first layer located between the layer including the poly(vinyl acetale) binder of the present invention and the hydrophilic support.

Examples of monomers copolymerized with the monomers containing at least one sulfonamide group include monomers as disclosed in EP 1 262 318, EP 1 275 498, EP 909 657, EP 1 120 246, EP 894 622, U.S. Pat. No. 5,141,838, EP 1 545 878 and EP 1 400 351. Monomers such as alkyl or aryl (meth)acrylate such as methyl (meth)acrylate, ethyl (meth)acrylate, butyl (meth)acrylate, benzyl (meth)acrylate, 2-phenylethyl (meth)acrylate, hydroxylethyl (meth) acrylate, phenyl (meth) acrylate; (meth)acrylic acid; (meth) acrylamide; a N-alkyl or N-aryl (meth)acrylamide such as N-methyl (meth)acrylamide, N-ethyl (meth)acrylamide, N-phenyl (meth)acrylamide, N-benzyl (meth)acrylamide, N-methylol (meth)acrylamide, N-(4-hydroxyphenyl)(meth) acrylamide, N-(4-methylpyridyl)(meth)acrylate; (meth) acrylonitrile; styrene; a substituted styrene such as 2-, 3- or 4-hydroxy-styrene, 4-benzoic acid-styrene; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl acetal; vinyl butyral; a vinyl ether such as methyl vinyl ether; vinyl amide; a N-alkyl vinyl amide such as N-methyl vinyl amide, caprolactame, vinyl pyrrolydone; maleimide; a N-alkyl or N-aryl maleimide such as N-benzyl maleimide, are preferred.

Suitable examples of sulfonamide (co)polymers and/or their method of preparation are disclosed in EP 933 682, EP 982 123, EP 1 072 432, WO 99/63407, EP 1 400 351 and EP 2 159 049. A highly preferred example of a sulfonamide (co)polymer is described in EP 2 047 988 A in [0044] to [0046].

Specific preferred examples of sulphonamide (co)polymers are polymers comprising N-(p-aminosulfonylphenyl) (meth)acrylamide, N-(m-aminosulfonylphenyl) (meth)acrylamide N-(o-aminosulfonylphenyl) (meth)acrylamide and or m-aminosulfonylphenyl (meth) acrylate.

(Co)polymers including an imide group are also preferred as a binder in the heat-sensitive coating. Specific examples include derivatives of methyl vinyl ether/maleic anhydride copolymers and derivatives of styrene/maleic anhydride copolymers, that contain an N-substituted cyclic imide monomeric units and/or N-substituted maleimides such as a N-phenylmaleimide monomeric unit and a N-benzyl-maleimide monomeric unit. Preferably, this copolymer is present in the first layer located between the layer including the poly(vinyl acetale) binder of the present invention and the hydrophilic support. This copolymer is preferably alkali soluble. Suitable examples are described in EP 933 682, EP 894 622 A [0010] to [0033], EP 901 902, EP 0 982 123 A [007] to [0114], EP 1 072 432 A [0024] to [0043] and WO 99/63407 (page 4 line 13 to page 9 line 37).

Polycondensates and polymers having free phenolic hydroxyl groups, as obtained, for example, by reacting phenol, resorcinol, a cresol, a xylenol or a trimethylphenol with aldehydes, especially formaldehyde, or ketones, may also be added to the heat-sensitive coating. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxy-phenylmaleimides are likewise suitable. Furthermore, polymers having units of vinylaromatics or aryl (meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl (meth)acrylate, of 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile.

The dissolution behavior of the coating can be fine-tuned by optional solubility regulating components. More particularly, developability enhancing compounds, development accelerators and development inhibitors can be used. In the embodiment where the coating comprises more than one layer, these ingredients can be added to the first layer and/or to the second layer and/or to an optional other layer of the coating.

Suitable developability enhancing compounds are (i) compounds which upon heating release gas as disclosed in WO 2003/79113, (ii) the compounds as disclosed in WO 2004/81662, (iii) the compositions that comprises one or more basic nitrogen-containing organic compounds as disclosed in WO 2008/103258 and (iv) the organic compounds having at least one amino group and at least one carboxylic acid group as disclosed in WO 2009/85093.

Examples of basic nitrogen-containing organic compounds useful in the developability-enhancing compositions are N-(2-hydroxyethyl)-2- pyrrolidone, 1 -(2-hydroxyethyl) piperazine, N-phenyldiethanolamine, triethanolamine, 2-[bis(2-hydroxyethyl)amino]-2-hydroxymethyl-1.3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Preferably N,N,N',N'-tetrakis(2-hydroxypropyl)-ethylenediamine is used. Mixtures of two or more of these compounds are also useful. The basic nitrogen-containing organic compounds can be obtained from a number of commercial sources including BASF (Germany) and Aldrich Chemical Company (Milwaukee, Wisc.).

The basic nitrogen-containing organic compound(s) is preferably present in the coating in an amount of from 1 to 30% wt, and typically from 3 to 15% wt, based on the total solids of the coating composition.

Preferably, one or more of the basic nitrogen-containing organic compounds are used in combination with one or more acidic developability-enhancing compounds, such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides, since such a combination may permit further improved developing latitude and printing durability. Representative examples of the acidic developability-enhancing compounds are provided in [0030] to [0036] of U.S. 2005/0214677. They may be present in an amount of from 0.1 to 30% wt based on the total dry weight of the coating composition. The molar ratio of one or more basic nitrogen-containing organic compounds to one or more acidic developability-enhancing compounds is generally from 0.1:1 to 10:1 and more typically from 0.5:1 to 2:1.

Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4''-trihydroxy-triphenylmethane, and 4,4',3'',4''-tetrahydroxy-3,5,3',5'-tetramethyltriphenyl-methane, and the like. Examples of the organic acids include sulphonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulphonic acid, dodecylbenzenesulphonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins comprising at least 70 mol % meta-cresol as recurring monomeric units are also suitable development accelerators.

In a preferred embodiment, the coating also contains developer resistance means, also called development inhibitors, i.e. one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP 823 327 and WO 97/39894 act as dissolution inhibitors due to interaction, e.g. by hydrogen bridge formation, with the alkali-soluble resin(s) in the coating. Inhibitors of this type typically are organic compounds which include at least one aromatic group and a hydrogen bonding site such as a nitrogen atom which may be part of a heterocyclic ring or an amino substituent, an onium group, a carbonyl, sulfinyl or sulfonyl group. Suitable dissolution inhibitors of this type have been disclosed in e.g. EP 825 927 and EP 823 327. Some of the compounds mentioned below, e.g. infrared dyes, such as cyanines, and contrast dyes, such as quaternized triarylmethane dyes, can also act as a dissolution inhibitor.

Other suitable inhibitors improve the developer resistance because they delay the penetration of the aqueous alkaline developer into the coating. Such compounds can be present in the first layer and/or in the optional second layer and/or in a development barrier layer on top of said layer, as described in e.g. EP 864 420, EP 950 517, WO 99/21725 and WO 01/45958. The solubility and/or penetrability of the barrier layer in the developer can be increased by exposure to heat and/or infrared light.

Water-repellent polymers represent another type of suitable dissolution inhibitors. Such polymers seem to increase the developer resistance of the coating by repelling the aqueous developer from the coating. The water-repellent polymers can be added to the first and/or second layer of the coating and/or can be present in a separate layer provided on top of these layers. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP 864 420, EP 950 517 and WO99/21725.

Preferred examples of inhibitors which delay the penetration of the aqueous alkaline developer into the coating include water-repellent polymers including siloxane and/or perfluoroalkyl units. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer is at least 2, preferably at least 10, more preferably at least 20. It may be less than 100, preferably less than 60.

The water-repellent polymer may be a block-copolymer or a graft-copolymer including a polar block such as a poly- or oligo(alkylene oxide) and a hydrophobic block such as a long chain hydrocarbon group, a polysiloxane and/or a perfluorinated hydrocarbon group. A typical example of a perfluorinated surfactant is Megafac F-177 available from Dainippon Ink & Chemicals, Inc. Other suitable copolymers comprise about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany.

A suitable amount of such a water-repellent polymer in the coating is between 0.5 and 25 mg/m$^2$, preferably between 0.5 and 15 mg/m$^2$ and most preferably between 0.5 and 10 mg/m$^2$. When the water-repellent polymer is also ink-repelling, e.g. in the case of polysiloxanes, higher amounts than 25 mg/m² can result in poor ink-acceptance of the non-exposed areas. An amount lower than 0.5 mg/m² on the other hand may lead to an unsatisfactory development resistance.

It is believed that during coating and drying, the water-repellent polymer or copolymer acts as a surfactant and tends to position itself, due to its bifunctional structure, at the interface between the coating and air and thereby forms a separate top layer, even when applied as an ingredient of the coating solution. Simultaneously, such surfactants also act as spreading agents which improve the coating quality. Alternatively, the water-repellent polymer or copolymer can be applied in a separate solution, coated on top of the coating including one or optional more layers. In that embodiment, it may be advantageous to use a solvent in the separate solution that is not capable of dissolving the ingredients present in the other layers so that a highly concentrated water-repellent phase is obtained at the top of the coating.

The coating of the heat-sensitive printing plate precursors described above preferably also contains an infrared light absorbing dye or pigment which, in the embodiment where the coating comprises more than one layer, may be present in the first layer, and/or in the second layer, and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. Preferred compounds are the following cyanine dyes:

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400,706 are suitable contrast dyes. Dyes which, combined with specific additives, only slightly color the coating but which become intensively colored after exposure, as described in for example WO2006/005688 may also be used as colorants. To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 μm, preferably from 0.1 to 3.0 μm, particularly preferably from 0.15 to 1.0 μm.

Optionally, the coating may further contain additional ingredients such as surfactants, especially perfluoro surfactants, silicon or titanium dioxide particles or polymers particles such as matting agents and spacers.

Any coating method can be used for applying one or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at 1/e² of maximum intensity: 5-25 μm), the scan speed and the resolution of the exposure apparatus (i.e. the number of addressable pixels per unit of linear distance, often expressed in dots per inch or dpi; typical value: 1000-4000 dpi).

After exposure, the precursor can be developed by means of a suitable processing liquid, such as an aqueous alkaline solution, whereby the non-image areas of the coating are removed; the development step may be combined with mechanical rubbing, e.g. by using a rotating brush. During development, any water-soluble protective layer present is also removed. The heat-sensitive printing plate precursors based on latex coalescence, can also be developed using plain water or aqueous solutions, e.g. a gumming solution as described in EP 1,342,568. Alternatively, such printing plate precursors can after exposure directly be mounted on a printing press and be developed on-press by supplying ink and/or fountain to the precursor.

The aqueous alkaline developer preferably comprises an alkaline agent which may be an inorganic alkaline agent such as an alkali metal hydroxide, an organic alkaline agent such as an amine, and/or an alkaline silicate such as an alkali metal silicate or an alkali metal metasilicate. The developer preferably has a pH above 8, more preferably above 10 and most preferably above 12. The developer may further contain components such as a buffer substance, a complexing agent, an antifoaming agent, an organic solvent, a corrosion inhibitor, a dye, an antisludge agent, a dissolution preventing agent such as a non-ionic surfactant, an anionic, cationic or amphoteric surfactant and/or a hydrotropic agent as known in the art. The developer may further contain a polyhydroxyl compound such as e.g. sorbitol, preferably in a concentration of at least 40 g/l, and also a polyethylene oxide containing compound such as e.g. Supronic B25, commercially available from RHODIA, preferably in a concentration of at most 0.15 g/l.

More details concerning the development step can be found in for example EP 1 614 538, EP 1 614 539, EP 1 614 540 and WO2004/071767.

Light-sensitive Printing Plate Precursors.

In addition to the above thermal materials, also light-sensitive coatings can be used. Typical examples of such plates are the UV-sensitive "PS" plates and the so-called photopolymer plates which contain a photopolymerizable composition that hardens upon exposure to light.

In a particular embodiment of the present invention, a conventional, UV-sensitive "PS" plate precursor is used. Suitable examples of such plates precursors, that are sensitive in the range of 300-450 nm (near UV and blue light), have been discussed in EP 1,029,668 A2. Positive and negative working compositions are typically used in "PS" plate precursors.

The positive working imaging layer preferably comprises an o-naphtoquinonediazide compound (NQD) and an alkali soluble resin. Particularly preferred are o-naphthoquinone-diazidosulphonic acid esters or o-naphthoquinone diazido-carboxylic acid esters of various hydroxyl compounds and o-naphthoquinone-diazidosulphonic acid amides or o-naph-thoquinone-diazidocarboxylic acid amides of various aromatic amine compounds. Two variants of NQD systems can be used: one-component systems and two-component systems. Such light-sensitive printing plates have been widely disclosed in the prior art, for example in U.S. Pat. No. 3,635,709, J.P. KOKAI No. 55-76346, J.P. KOKAI No. Sho 50-117503, J.P. KOKAI No. Sho 50-113305, U.S. Pat. Nos. 3,859,099; 3,759,711; GB-A 739654, U.S. Pat. No. 4,266,001 and J.P. KOKAI No. 55-57841.

The negative working layer of a "PS" plate preferably comprises a diazonium salt, a diazonium resin or an aryl-diazosulfonate homo- or copolymer. Suitable examples of low-molecular weight diazonium salts include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde. Examples of diazo resins include condensation products of an aromatic diazonium salt as the light-sensitive substance. Such condensation products are described, for example, in DE-P-1 214 086. The light- or heat-sensitive layer preferably also contains a binder e.g. polyvinyl alcohol.

Upon exposure the diazo resins or diazonium salts are converted from water soluble to water insoluble (due to the destruction of the diazonium groups) and additionally the photolysis products of the diazo may increase the level of crosslinking of the polymeric binder or diazo resin, thereby selectively converting the coating, in an image pattern, from water soluble to water insoluble. The unexposed areas remain unchanged, i.e. water-soluble.

Such printing plate precursors can be developed using an aqueous alkaline solution as described above.

In a second suitable embodiment, the light sensitive printing plate precursor is based on a photo-polymerisation reaction and contains a coating comprising a photocurable composition comprising a free radical initiator (as disclosed in for example U.S. Pat. Nos. 5,955,238; 6,037,098; 5,629,354; 6,232,038; 6,218,076;5,955,238; 6,037,098; 6,010,824; 5,629,354; DE 1,470,154; EP 024,629; EP 107,792; U.S. Pat. No. 4,410,621; EP 215,453; DE 3,211,312 and EP A 1,091,247) a polymerizable compound (as disclosed in EP1, 161,4541, EP 1349006, W02005/109103 and unpublished European patent applications EP 5,111,012.0, EP 5,111, 025.2, EP 5110918.9 and EP 5, 110,961.9) and a polymeric binder (as disclosed in for example U.S. 2004/0260050, U.S. 2005/0003285; U.S. 2005/0123853; EP 1,369,232; EP 1,369,231; EP 1,341,040; U.S. 2003/0124460, EP 1 241 002, EP 1 288 720, U.S. Pat. Nos. 6,027,857, 6,171,735; 6,420, 089; EP 152,819; EP 1,043, 627; U.S. Pat. No. 6,899,994; U.S. 2004/0260050; U.S. 2005/0003285; U.S. 2005/ 0170286; U.S. 2005/0123853; U.S. 2004/0260050; U.S. 2005/0003285; U.S. 2004/0260050; U.S. 2005/0003285; U.S. 2005/0123853 and U.S. 2005/0123853). Other ingredients such as sensitizers, co-initiators, inhibitors, adhesion promoting compounds, colorants, surfactants and/or printing out agents may optionally be added. These printing plate precursors can be sensitized with blue, green or red light (i.e. wavelength range between 450 and 750 nm), with violet light (i.e. wavelength range between 350 and 450 nm) or with infrared light (i.e. wavelength range between 750 and 1500 nm) using for example an Ar laser (488 nm) or a FD-YAG laser (532 nm), a semiconductor laser InGaN (350 to 450 nm), an infrared laser diode (830 nm) or a Nd-YAG laser (1064 nm).

Typically, a photopolymer plate precursor is processed in alkaline developer having a pH>10 (see above) and subsequently gummed. Alternatively, the exposed photopolymer plate precursor can also be developed by applying a gum solution to the coating whereby the non-exposed areas are removed. Suitable gumming solutions are described in WO2005/111727. After the exposure step, the imaged precursor can also be directly mounted on a press and processed on-press by applying ink and/or fountain solution. Methods for preparing such plates are disclosed in WO 93/05446, U.S. Pat. No. 6,027,857, 6,171,735, 6,420,089, 6,071,675, 6,245,481, 6,387,595, 6,482,571, 6,576,401, 6,548,222, WO 03/087939, U.S. 2003/16577 and U.S. 2004/13968.

To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 µm, preferably from 0.1 to 3.0 µm, particularly preferably from 0.15 to 1.0 µm.

Optionally, the coating may further contain additional ingredients such as surfactants, especially perfluoro surfactants, silicon or titanium dioxide particles, organic or inorganic spacer particles or matting agents.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

Switchable and Ablative Heat-sensitive Printing Plate Precursors.

The imaging mechanism of these printing plate precursors can be triggered by direct exposure to heat, e.g. by means of a thermal head, or by the light absorption of one or more compounds in the coating that are capable of converting light, more preferably infrared light, into heat. The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser.

The heat-sensitive coating may comprise a switchable polymer which is capable of changing the hydrophilic/hydrophobic-balance of the surface of the heat-sensitive coating due to heat generated during the exposure step with infared radiation. Usually such printing plates can be used directly on the printing press, but an additional wet developing step such as an on-press developing step or an off-press developing step may be used.

Typical examples of such systems are the thermally induced cleavage of labile groups pendant from a polymer backbone as described in WO 92/9934, EP 652 483 and EP 1 787 810, polymeric systems which ablate from the support or which depolymerise upon heating, the thermal cyclodehydration of polyamic acids with hydrazide groups as described in U.S. Pat. No. 4,081,572, the thermally induced destruction or generation of a charge on polymers as described in EP 200 488, the thermally induced rupture of encapsulated reactive material as described in U.S. Pat. No. 5,569,573, EP 646 476, WO 94/2395, WO 98/29258, the image-wise crosslinking of a water-soluble bottom layer with a phenolic top layer as described in JP 10069089, the heat-sensitive hyperbranched polymers containing heat-sensitive active end groups as described in U.S. Pat. No. 6,162,578, and the polarity switchable image-forming materials as described in EP 1 129 861.

The heat sensitive plate may be an ablative plate which is a processless plate, i.e. a plate which does not require any processing and therefore can be used as a printing plate immediately after exposure. In the recording layer of such an ablative plate, heat which is generated upon light absorption by an infrared absorber—as described above for heat-sensitive printing plate precursors—removes a hydrophilic or oleophilic topcoat whereby an underlying oleophilic respectively hydrophilic surface is revealed, thereby obtaining the necessary differentiation of ink-acceptance between the image (printing) and non-image (non-printing) areas.

The heat and/or light sensitive printing plates can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

The present invention will be described in detail with reference to the following examples, but the invention is not limited thereto. The examples are performed with Thermostar P970, printing plate precursor commercially available from Agfa Graphics N.V.

1. Plate Exposure.

The commercial printing plate precursor Thermostar P970 (745 mm×605 mm) was image-wise exposed at a range of energy densities with a Creo Trendsetter, a platesetter having a 40 W infrared laser head (830 nm), operating at 150 rpm and 2400 dpi, commercially available from Eastman Kodak Corp., to obtain 200 mJ/cm$^2$. The recorded image had a 0% dot coverage. Five plates were consecutively exposed to illustrate that the invention is not dependent on the amount of exposed plates.

2. Electrostatic Generator.

The electrostatic generator was installed on the imager Creo Trendesetter (see above). A SIMCO Linear 6 pinner electrode DC positive electrostatic generator, commercially available form SIMCO-ION was mounted on the laser head at 20 to 30 mm from the grounded drum cylinder and as far as possible from the laser carriage. The optimal distance from the electrostatic generator to the plate surface is established by experiment. When adjusted properly, formation of ablation dust is reduced/prevented and no spark-over from the electrodes to the printing plate occurs.

Metal parts in the immediate vicinity of the electrostatic generator may influence the associated electromotive force and as a result, the charging effect may be modified and/or even be disrupted. Therefore, a minimum distance between the electrostatic generator and metal parts in the platesetter should be taken into account, for example a distance of about 70 mm.

In this set-up, the charging bar is placed in the platesetter in such a way that the surface of the coating can be charged before it is imaged. The charging bar is typically activated just before the exposure starts. Upon charge stimulation, the surface of the coating becomes electrostatically charged, while the responsive aluminium substrate becomes countercharged. The surface of the coating is charged prior to the imaging, as the charged area width is significantly larger than the laser swath width.

In Table 1 below, the generated current in relation to electromotive force by the electrostatic generator for a distance between the electrostatic generator and the aluminum plate of 30 mm are given.

TABLE 1 charging conditions of the electrostatic generator

| Generated current | Related electromotive force |
|---|---|
| 10 μA | 8.8 kV |
| 20 μA | 12 kV |
| 40 μA | 16 kV |

3. Ablation

The ablation behaviour of the commercial printing plate precursor P970 was tested according to the ablation test method described below. The results of the ablation test are shown in the photograph and in Table 2 below.

Ablation Test Method

In a first step, ablation dust is collected via the Fast Filter Collection (FFC) method. Subsequently, the Total Organic Carbon (TOC) measurement provides an accurate value of weight of the released solid dust per plate surface (e.g. mg carbon/m$^2$).

Fast Filter Collection

The Fast Filter Collection (FFC) method is performed on the Creo Trendsetter, a platesetter having a 20 W infrared laser head (830 nm), operating at 140 rpm and 2400 dpi, commercially available from Eastman Kodak Corp.

A filter (Pallflex™ Membrambe Filter Tissu; Quartz 47 mm; rec. no. 7202) is placed between the laser head and the vacuum cleaner, directly after the laser head. The filter is blocked between a grid and a support. A surface area of the plate of about 4000 cm$^2$ is exposed and the dust is collected on 11 cm$^2$ of filter.

One measurement lasts about 5 to 10 minutes. Subsequently, the level of ablation is quantified by means of the Total Organic Carbon (TOC) measurement.

Total Organic Carbon (TOC) measurement

TOC analysis is a quantitative method providing a total weight of all organic carbon atoms present in the sample obtained by the FFC method. The amount of carbon atoms which were released during the exposure step due to the ablation phenomenon—i.e. mg carbon/m$^2$—is obtained and gives an idea about the degree of ablation.

More details concerning this measurement can be found in the following standards:

ISO NBN EN 15936/2012: Sludge, treated bio-waste, soil and waste—Determination of total organic carbon (TOC) by dry combustion. NBN EN 13137/2001: Characterization of waste—Determination of total organic carbon (TOC) in waste, sludges and sediments.

Results

Upon or just before the exposure step, the electrostatic generator was activated generating a current of respectively 10 μA, 15 μA and 20 μA. As a reference sample the same exposure step was carried out without activating the electrostatic generator. The results of the fast filter collection are shown in the following photograph and of the TOC analyse in Table 2 below.

Figure 3:
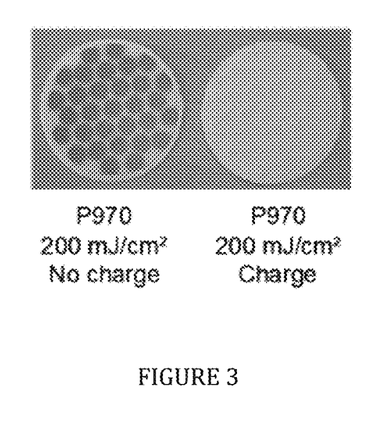
FIG. 3 shows a fast filter collection.

FIG. 3 shows a fast filter collection at 20 μA.

TOC Analysis

TABLE 2

Results of the TOC analysis.

| Current | mg C/m$^2$ First plate* | mg C/m$^2$ Fifth plate* |
|---|---|---|
| no | 40** | 40** |
| 10 μA | 0 | 0 |
| 15 μA | 0 | 0 |
| 20 μA | 0 | 0 |

*P970 commercially available form Agfa Graphics NV exposed with 200 mJ/m$^2$
**batch driven The results visualised on the photograph and presented in Table 2 indicate that by generating a charge of 10 μA, 15 μA or 20 μA no ablation dust is detected.

The invention claimed is:

1. A system for exposing a heat and/or light sensitive printing plate precursor including a coating on a support, the system comprising:
    a platesetter including a laser head that generates a laser beam to create an image; and
    an electrostatic generator that electrostatically charges a surface of the coating.

2. The system according to claim 1, wherein the electrostatic generator electrostatically charges the surface of the coating to become positively or negatively charged.

3. The system according to claim 1, wherein the electrostatic generator includes at least one charging bar and a DC high voltage generator.

4. The system according to claim 3, wherein the DC high voltage generator generates a current of 0.5μA or more.

5. The system according to claim 3, wherein the at least one charging bar includes at least one pinner electrode.

6. The system according to claim 3, wherein the at least one charging bar includes 4 to 6 pinner electrodes.

7. The system according to claim 3, wherein the at least one charging bar includes at least one wire electrode.

8. The system according to claim 7, wherein the at least one wire electrode includes 5 to 500 electrodes.

9. The system according to claim 1, wherein the platesetter includes an external drum.

10. The system according to claim 1, wherein the platesetter includes an internal drum.

11. The system according to claim 1, further comprising the heat and/or light sensitive printing plate precursor, and the support is a grained and anodized aluminum support.

12. The system according to claim 1, further comprising the heat and/or light sensitive printing plate precursor, and the coating includes an infrared absorbing agent and a heat-sensitive oleophilic resin.

13. The system according to claim 1, further comprising the heat and/or light sensitive printing plate precursor, and the coating includes an infrared absorbing agent, hydrophobic thermoplastic polymer particles, and a hydrophilic binder.

14. A method for making a lithographic printing plate comprising the steps of:
    applying a heat and/or light sensitive coating onto a support to obtain a printing plate precursor;

image-wise exposing the precursor with the system according to claim 1; and
optionally developing the precursor.

15. The method according to claim 14, wherein the surface of the coating is electrostatically charged before the step of image-wise exposing the precursor.

\* \* \* \* \*